United States Patent [19]

Chin et al.

[11] Patent Number: 4,847,119
[45] Date of Patent: Jul. 11, 1989

[54] SEMICONDUCTOR HOLDING FIXTURE AND METHOD

[75] Inventors: Aland K. Chin, Sharon; John W. Ford, Jr., Framingham, both of Mass.; Siamak Forouhar, Pasadena, Calif.

[73] Assignee: Polaroid Corporation, Cambridge, Mass.

[21] Appl. No.: 79,583

[22] Filed: Jul. 30, 1987

[51] Int. Cl.$^4$ .................. B05D 1/32; B05C 13/02; C23C 16/04
[52] U.S. Cl. .................. 427/282; 29/559; 118/503; 118/505; 118/721; 118/728; 427/248.1
[58] Field of Search ............ 118/503, 505, 500, 728, 118/721; 269/254 R; 29/539; 427/282, 248.1

[56] References Cited

U.S. PATENT DOCUMENTS 4,385,083 5/1983 Shelley ............... 427/240

Primary Examiner—Evan Lawrence
Attorney, Agent, or Firm—Leslie J. Payne; Edward S. Roman

[57] ABSTRACT

There is disclosed a method and apparatus for easily mounting, holding and facilitating the coating of preselected areas of very thin semiconductor samples. The apparatus includes a base adapted for placement in a coating chamber. The base includes a pair of spaced apart supporting arms onto which a plurality of stacked samples can be loaded. A cover is then slidably positioned over the stacked samples to hold the stacked samples in position during coating. The cover in conjunction with the supporting arms define an open sided cavity to enable the samples to be coated. The apparatus also can be used to hold only one sample.

12 Claims, 3 Drawing Sheets

SEMICONDUCTOR HOLDING FIXTURE AND METHOD

BACKGROUND OF THE INVENTION

In general this invention relates to a holding apparatus and method for use in easily mounting and holding a plurality of very thin samples, preferably of semiconductor material, to be coated in a stacked relationship, whereby preselected opposite surfaces of the samples can be coated while in a stable orientation.

The coating of extremely thin and small samples with coating substances is quite often a tedious and time consuming task. For example, it is desirable to coat preselected opposite portions of extremely thin uncoated segments of such samples, wherein the uncoated segments have dimensions in the order of about 0.250 inches × 0.004 inches without having to remove the samples from a holding device.

One known approach for coating small and extremely thin samples is described generally in U.S. Pat. No. 4,385,083; wherein there is disclosed a relatively complicated screw-loaded mechanism for holding a single sample to be coated. Such a mechanical arrangement has many obvious shortcomings especially when more than a single sample is to be coated. If several samples are to be coated at a single time, what is normally required is that an operator using tweezers or the like, mounts the samples in a stacked, side-by-side and parallel relationship across a coating recess or area formed in a sample holder. It will be appreciated that such stacking is arduous and the resulting stack is relatively unstable. Of course, this instability enhances the likelihood of the stack collapsing when encountering even slight vibrations. Additionally, it is not uncommon for the samples to fall through a coating recess or area, such samples are supposed to bridge. The cumulative effect of such a procedure is an unnecessary lengthy loading time.

SUMMARY OF THE INVENTION

It is an object of this invention to overcome the drawbacks enumerated above when coating a plurality of extremely thin samples. Towards this end the present invention comprises a holding assembly for use in facilitating coating segments of a plurality of extremely thin samples.

In an illustrated embodiment, there is provided a base adapted for placement into a coating chamber. The base has a support surface and a pair of spaced apart guide portions extending upwardly from the support surface. There is provided a pair of sample supporting arms laterally extending in spaced apart relationship to each other and defining therebetween a coating opening which allows the samples to be coated. The supporting arms define a pair of spaced apart notches each of which is sized and shaped to support an end portion of a plurality of stacked samples loaded thereon. Slidably mounted on the support surface is a covering means for selectively covering the stacked samples and for being guided by the guide portions between a position facilitating sample coating and a position facilitating sample loading. The samples can be loaded onto the notches so as to extend therebetween in a stacked and parallel relationship to each other. The covering means, when in a covering position, defines conjointly with the supporting arms, an open sided cavity. The cavity has a cross-sectional shape slightly larger than the stacked samples so as to facilitate retaining the samples in the stacked relationship. In such embodiment, there is provided means for selectively securing the covering means to the base in a plurality of positions. For selectively retaining the stacked samples in the cavity, there is provided means for applying a loading force to the stack in a direction generally perpendicular to an endmost one of the stack. The samples need not be removed from the holding assembly in order to coat the opposite surfaces.

In another illustrated embodiment, there is provided a sample holding device being sized and shaped to block the coating opening so as to prevent the samples from falling between the supporting arms.

In another illustrated embodiment, there is provided resilient biasing means which comprises a handle and an elongated portion which is sized and dimensioned to have a curvature so that the elongated portion, when removably inserted in the cavity, is biased to frictionally engage both the covering means and the supporting arms as well as the endmost sample of the stacked samples.

In another illustrated embodiment, there is provided a holding assembly mount which is adapted to be held in a coating chamber and includes a ramp and means for releasably holding the holding assembly to the ramp so that the samples are held in a predetermined orientation when in the coating chamber so as to eliminate creation of a shadow being created on the samples when they are coated.

This invention also relates to a method, whereby the plurality of extremely thin samples can be mounted in an easy and efficient manner so as to enhance their stability during a coating operation. In one embodiment of the method, the samples are held in a fashion which eliminates creation of a shadow.

Among other objects of this invention are, therefore, the provision of a coating method and holding assembly which facilitates relatively quick and easy mounting of extremely small and thin samples which are to be coated; and, the provision of an assembly which supports the samples in a stable desired orientation during coating.

These and other objects, features and the invention itself will become apparent from the following description when taken in conjunction with the accompanying drawings wherein like structure throughout the several views are indicated by like reference numerals.

DETAILED DESCRIPTION

Figure 1:
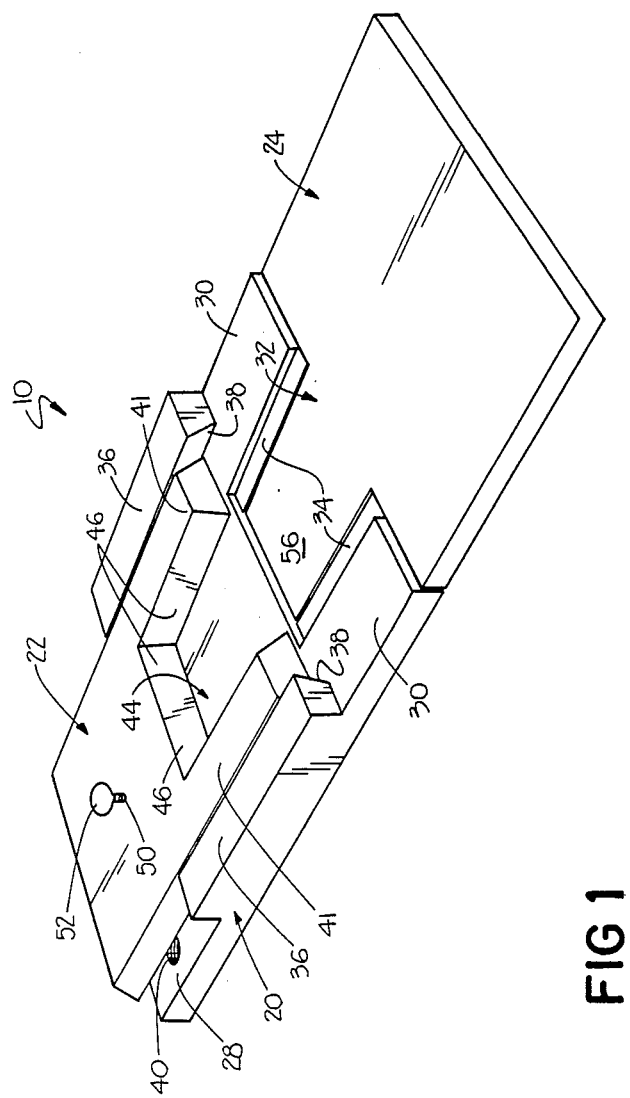
FIG. 1 is a perspective view of a holding assembly made in accordance with the principles of the present invention.
Figure 2:
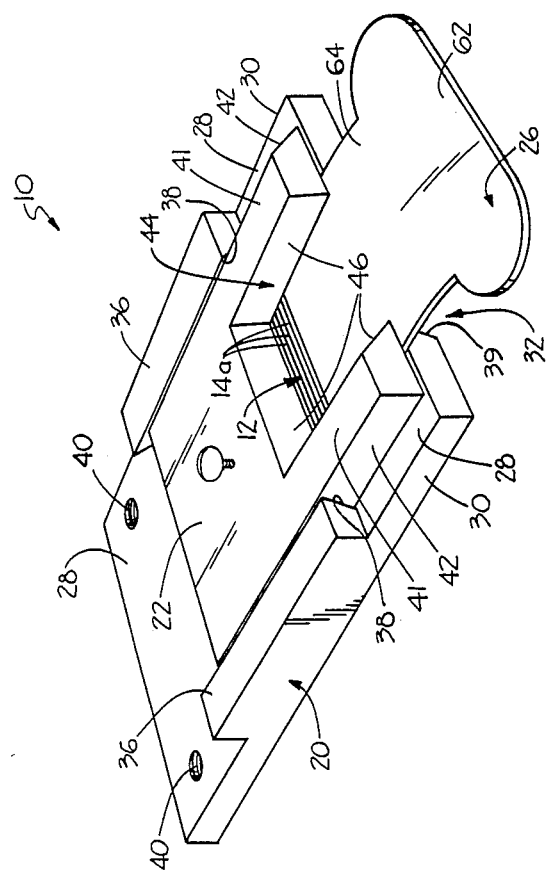
FIG. 2 is a perspective view of the holding assembly of the present invention illustrating the samples in a stacked and loaded situation.
Figure 3:
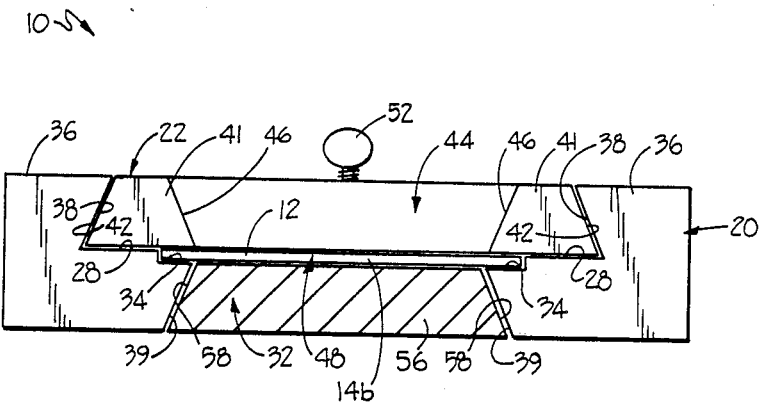
FIG. 3 is an end view of the holding assembly of the present invention.

Reference is made to FIGS. 1–4 for illustrating a preferred embodiment of a holding assembly 10 made in accordance with the principles of the present invention. The holding assembly 10 is constructed in a manner to retain a plurality of extremely small and thin rectangular semiconductor samples 12 (FIGS. 2 and 3). For purposes of illustration, each of the semiconductor samples can have a dimension of 0.010×0.250×0.004 inches. Preselected opposing surfaces 14a, 14b will substantially have their entire surface area coated with a suitable coating material, for example, $Al_2O_3$. It should be noted that although semiconductor samples are described in this embodiment as the objects being coated, other kinds of materials of a similar size and configuration can be handled for coating purposes.

As will be explained later, the holding assembly 10 is adapted to be removably received within a coating chamber diagrammatically shown at 16 of a coating evaporator (not shown). It is to be pointed out that the present invention is not concerned with the type of coating evaporator being used. Thus, any suitable kind may be employed.

Essentially, the semiconductor holding assembly 10 includes base block 20, slidable cover 22, loading support member 24, and biasing spring 26.

Reference is now made to FIGS. 1–3 for best illustrating the base block 20 which is seen to comprise a generally planar support surface 28 that facilitates sliding movement of the slidable cover 22. The base block 20 is formed with a pair of spaced apart and parallel sample support arms 30 which define therebetween a coating recess or opening 32. The opening 32 facilitates, as will be described, the deposition of the coating material on surfaces 14a, 14b of the stacked semiconductor samples 12. Each of the sample support arms 30 is formed with generally planar shelf portion 34. The shelves are slightly lower than the planar support surface 28 by an amount which facilitates loading and retention of the semiconductor samples 12 in the manner more clearly shown in FIG. 3. It is, of course, desirable to have the width of the shelf portions 34 as small as possible so as to facilitate optimum coating of the surfaces 14a, 14b while still providing adequate support for the samples 12 in their stacked relationship. The shelf portions 34 on the support arms 30 define a pair of sample supporting means.

By way of illustration, the width of each of the shelves 34 is preferably 0.020 inches and the shelves are preferably about 0.015 inches below the planar support surface 28. Although the aforementioned dimensions are preferred, it will be understood that the width of each of the shelves may be within the range of 10 to 50 mils and the distance by which the shelves may be below the planar support surface 28 may be within the range of 12 to 25 mils. The length of the shelves 34 is such as to accomodate a plurality of stacked samples 12.

With continued reference to the base block 20, it will be seen that it has formed integrally therewith a pair of upstanding, generally parallel and spaced apart guiding portions 36. The guiding portions 36 are formed so as to define spaced apart and generally parallel bevelled sidewalls 38. Also, each of the support arms 30 is formed with a bevelled surface 39, such as best shown in FIG. 3. The converging surfaces 39 have an angle of inclination which will avoid a shadow effect being created on the surfaces 14b as the latter are being coated. A pair of threaded openings 40 is formed in the base block 20.

Reference is now made to FIGS. 1–3 for showing the slidable cover member 22. The cover member 22 is mounted for sliding movement in a generally horizontal direction between a loading position (FIG. 1) and a closing position (FIG. 2). The cover member 22 has a smooth bottom surface which slides on the supporting surface 28. There is provided a pair of parallel and spaced apart arms 41 having bevelled sidewalls 42 which are adapted to slidingly engage within a channel defined by the sidewalls 38 so as to have a relatively tight slidable engagement therewith. One end of the cover member 22 is formed with a rectangular exposure recess 44, which when the cover member is in the covering position (FIG. 2), is in general alignment with the opening 32 to facilitate coating of the surfaces 14a of the semiconductor samples 12. The sidewalls 46 surrounding the recess 44 are bevelled so as to eliminate any shadow effect which might otherwise be produced during the coating operation. As best observed in FIG. 3, the bevelled walls 46 terminate at a distance which is generally flush to the outer edge of the shelves 34 (FIG. 3). The cooperation between the cover member 22 and the lateral support arms 30 is to define a generally rectangular cavity 48 which is adapted to hold respective opposite ends of the stacked semiconductor samples 12. In this embodiment, the cover member 22 and the top surfaces of the shelves 34 which form the cavity 48 are spaced apart by a distance which facilitates retention of the samples therein, for purposes of illustration this distance can be about 15 mils.

The center of the cover member 22 is formed with a threaded aperture 50 through which cooperates with a threaded set screw 52. The set screw 52 is adapted to selectively engage the support surface 28 when it is tightened. As the result of this action, the cover member 22 is lifted upwardly drawing the complementary shaped bevelled sidewalls 38 and 42 into tight frictional engagement so as to lock the cover member 22 in any desired position. Of course, by loosening the set screw 52, the cover member 22 is free to move along on the base block 20.

It will be appreciated that such an arrangement provides means for securing the cover member 22 to the base block 20 at any desired location.

Given the fact that the semiconductor samples 12 are extremely thin and small, it will be appreciated that loading them in an edgewise stacked relationship on the shelves 34 is extremely difficult. To prevent the samples 12 from falling through the opening 32 there is provided a sample support platform 24 (FIG. 1).

The support platform 24 has a rectangular semiconductor support segment 56 which is slidably received within the exposure recess 44. The top of the support segment 56 has its top surface generally flush with the shelves 34. The support segment 56 has bevelled sidewalls 58 which slidably engage with the bevelled sidewalls 39 formed on the base block 20. The support segment 56 prevents the semiconductor samples 12 from falling between the shelves 34. Upon completion of the sample loading operation, the support platform 24 is removed from the base block 20. It will be noted that the support platform 24 can remain in the desired cooperative relationship by using an adhesive strip (not shown) for example, to join the bottom of the platform to the bottom of the support arms.

For purposes of resiliently biasing the semiconductor samples 12 in the noted stacked relationship there is provided a spring member 26 which includes a tab or handle 62 and a flat and thin elongated portion 64. The elongated portion 64 should, of course, be thin enough to slidably fit within the cavity 48, for example, it can be 10 mils thin. Although 10 mils is preferred, it will be understood that the thickness of the elongated portion 64 can be in the range of 5 to 20 mils. For providing resiliency to the elongated portion 64, such portion has a curvature along its longitudinal extent as shown best in FIG. 2. Because the elongated portion has such a curvature, it has a static frictional engagement with the bottom surfaces of the arms 41 and the surfaces of the shelves 34 sufficient to prevent undesired movement of the stacked samples 12 while the holding assembly is being moved. The enlarged handle 62 facilitates manual insertion and removal of the spring 26 from the cavity 48.

In this embodiment, the spring 26 provides a resilient biasing means for applying a biasing force to the stacked samples 12 in a direction generally perpendicular to a cross-sectional plane of the cavity. It will be appreciated that the end of the elongated portion 64 contacts the end unit of the stacked samples 12.

Of course, before the samples are to be coated, the supporting platform 24 is removed. This is accomplished by removing adhesive tape (not shown) which joins the platform 24 to the base block 20. Then a user may mount the holding assembly 10 to a fixture 66 mounted within the chamber 16.

Figure 4:
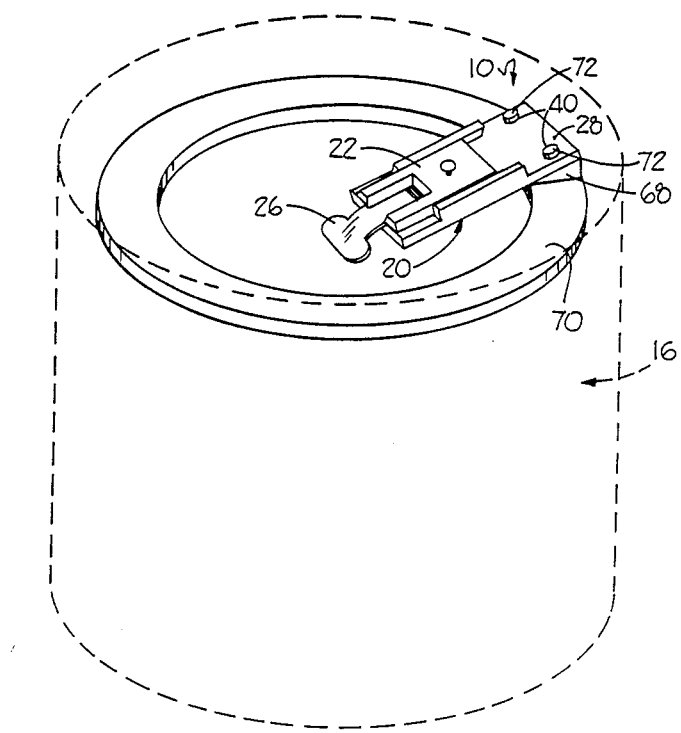
FIG. 4 is a perspective view of the holding assembly in a coating apparatus which is diagrammatically depicted.

As shown in FIG. 4, the mounting fixture 66 is provided with an inclined ramp 68 having a top surface at an angle in relationship to a generally vertical path taken by the coating material (not shown), when the holding assembly 10 is mounted on the fixture 66. For purposes of illustration, the ramp 68 is at an angle of about 10° to a horizontal plane which includes an annular base portion 70. The base portion 70 is annular because the chamber 16 is circular. The base portion 70 can have other configurations depending on the shape and size of the chamber 16 being used. Returning to the ramp 68, it can be at other angles, for example, in a range of 5° to 20°. Such angles have been selected because they, in effect, tilt the surfaces 14a, 14b to the normally vertically travelling vapors. This compensates for the fact that the coating materials might not travel completely vertically during the deposition process, thereby resulting in an incomplete coating or shadow effect of the desired surfaces being coated. For releasably securing the holding assembly 10 to the ramp 68, the latter is provided with threaded members 72 which extend upwardly therefrom and threadedly cooperate with the openings 40. The threaded members 72 can be manipulated from the bottom of the base 70. It will be appreciated that the respective surfaces 14a, 14b are coated one at a time. First either surfaces 14a or surfaces 14b are coated in the chamber 16. Then the holding assembly 10 is removed from the chamber 16 and re-introduced in an inverted manner so that the other set of surfaces are coated. Of course, the holding assembly 10 is appropriately secured to ramp 68 in an inverted position.

Based on the foregoing description of the construction of the holding assembly 10, it is believed that its operation is apparent.

Advantageously, the holding assembly 10 is especially useful for facilitating the proper orientation of a stack of semiconductor samples 12 which are to be coated. Because of the present holding assembly 10 there is provided a significantly easy and reliable approach to mount and retain extremely small and thin samples.

The present invention may be embodied in other specific forms without departing from the spirit or essential characteristics thereof. For example, the method and apparatus could be applied to the treatment of just one sample. The present embodiment is, therefore, to be considered in all respects as illustrative and not restrictive. The scope of the invention being indicated by the appended claims rather than by the foregoing description, all changes which come within the meaning and the range of equivalency of the claims are therefore intended to be embraced therein.

What is claimed is:

1. A holding assembly for use in loading and retaining at least one sample which is to be coated, said holding assembly comprising:

a base adapted for placement into a coating chamber, said base having a support surface, a pair of spaced apart guide portions extending upwardly from said support surface, and a pair of sample supporting means laterally extending in spaced apart relationship to each other and defining therebetween a coating opening which allows at least one sample to be coated;

covering means mounted slidably on said support surface and being guided by said guide portions for movement between a position facilitating sample loading and a sample covering position; wherein: when said covering means is in a loading position, at least one sample can be loaded onto said supporting means, or a plurality of samples can be loaded in stacked and parallel relationship to each other, and when in a covering position defines conjointly with said supporting means an open sided cavity which has a cross-sectional shape slightly larger than the same so as to facilitate retaining one sample or a plurality of samples in a stacked relationship;

means for releasably securing said covering means in a plurality of positions on said base; and means for resiliently biasing the sample in said cavity by applying a biasing force to the sample in a direction generally perpendicular to a cross-sectional plane of said cavity.

2. The assembly of claim 1 further including a sample holding device being sized and shaped to fit beneath and block said coating opening so as to prevent, the sample from falling between said supporting means when said sample is being loaded.

3. The assembly of claim 1 wherein: said resilient biasing means has a frictional sliding fit with said covering means and said supporting means and can be moved into and out of said cavity.

4. The assembly of claim 3 wherein: said biasing means includes a handle and an elongated generally flat portion extending integrally therefrom, said elongated portion having a curvature along its length so that said elongated portion frictionally engages both said covering means and said supporting means and provides said reslinet force so as to bias the sample.

5. The assembly of claim 1 wherein: said covering means has a pair of opposed bevelled surfaces, each sized and shaped to slidingly engage a respective one of said pair of guiding portions.

6. The assembly of claim 1 wherein: said means for releasably securing said covering means includes a threaded member which cooperates with a threaded bore formed in said covering means, whereby when said threaded member is rotated in one direction, it engages said supporting surface to thereby urge said covering means upwardly so that said bevelled surfaces tightly frictionally engage said guided portions to secure said covering means is a preferred position and when said threaded member is rotated in the opposite direction said covering means is allowed to slidably move on said supporting surface.

7. The assembly of claim 1 wherein each of said supporting means includes a shelf for receiving end portions of the sample, said shelves being opposed from each other.

8. The assembly of claim 7 wherein each shelf has a width in the range of 10 to 50 mils; and is below said supporting surface by a distance in the range of 12 to 25 mils.

9. The assembly of claim 4 wherein said elongated portion has a thickness in the range of 5 to 20 mils.

10. A method of coating preselected portions of at least one small and thin rectangular sample comprising the steps of:
mounting opposed end portions of at least one sample on spaced apart supporting surfaces which define a coating opening therebetween;
blocking one end of the coating opening by a blocking member so as to prevent the sample from falling between the supporting surfaces while the sample is being mounted;
covering at least the end portions of the sample with a covering member which in conjunction with the supporting surfaces defines an open side cavity and which supports the sample on the supporting surfaces, thereby facilitating coating of the preselected portions thereof;
removing the blocking member after mounting and covering of the sample, thereby exposing the preselected portions of the sample to be coated; biasing the sample with a releasably member which provides a resilient force directed in a direction generally perpendicular to a side plane of the sample;
mounting the assembly holding the sample in a coating chamber; and
coating the sample in such a manner that the preselected portions of the sample are coated by vertically rising coating material.

11. The method of claim 10 wherein: the step of mounting the assembly in a coating chamber includes mounting the assembly in a range of preselected orientations with respect to the vertical which prevents a shadow effect being formed on the exposed preselected portions.

12. A method of holding at least one small and thin rectangular sample comprising the steps of:
mounting opposed end portions of the sample on spaced apart supporting surfaces which define a coating opening therebetween;
blocking one end of the coating opening by a blocking member so as to prevent the sample from falling between the supporting surfaces while the sample is being mounted;
covering at least the end portions of the sample with a covering member which in conjunction with the supporting surfaces defines a cavity and which supports the sample on the supporting surfaces, thereby facilitating coating of preselected portions thereof;
removing the blocking member after mounting and covering of the sample thereby exposing the preselected portions of the sample to be coated; and
biasing the sample with a releasably member which provides a resilient force directed in a direction generally perpendicular to a side plane of the sample.

* * * * *